(12) United States Patent
Punzalan et al.

(10) Patent No.: US 8,278,148 B2
(45) Date of Patent: Oct. 2, 2012

(54) INTEGRATED CIRCUIT PACKAGE SYSTEM WITH LEADS SEPARATED FROM A DIE PADDLE

(75) Inventors: Jeffrey D. Punzalan, Singapore (SG); Jairus Legaspi Pisigan, Singapore (SG); Lionel Chien Hui Tay, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 704 days.

(21) Appl. No.: 11/854,989

(22) Filed: Sep. 13, 2007

(65) Prior Publication Data

US 2009/0072364 A1    Mar. 19, 2009

(51) Int. Cl.
*H01L 23/495* (2006.01)

(52) U.S. Cl. ........ 438/111; 257/666; 257/668; 257/676; 257/E21.502; 257/E23.031; 438/123

(58) Field of Classification Search ................... 257/676, 257/E23.031, E23.032, 666, 668; 438/111, 438/123
See application file for complete search history.

(56) References Cited

U.S. PATENT DOCUMENTS

| | | | | |
|---|---|---|---|---|
| 5,973,388 A * | 10/1999 | Chew et al. | | 257/676 |
| 6,501,156 B1 * | 12/2002 | Nakanishi et al. | | 257/666 |
| 6,818,973 B1 * | 11/2004 | Foster | | 257/676 |
| 6,876,068 B1 | 4/2005 | Lee et al. | | |
| 6,995,459 B2 * | 2/2006 | Lee et al. | | 257/676 |
| 7,102,209 B1 * | 9/2006 | Bayan et al. | | 257/666 |
| 2003/0045032 A1 * | 3/2003 | Abe | | 438/123 |
| 2003/0071333 A1 * | 4/2003 | Matsuzawa | | 257/676 |
| 2005/0051877 A1 * | 3/2005 | Hsu | | 257/667 |
| 2005/0139969 A1 * | 6/2005 | Lee et al. | | 257/672 |
| 2007/0281392 A1 * | 12/2007 | Yee et al. | | 438/111 |

* cited by examiner

*Primary Examiner* — Peniel M Gumedzoe
(74) *Attorney, Agent, or Firm* — Ishimaru & Associates LLP; Miko Ishimaru; Stanley M. Chang

(57) ABSTRACT

An integrated circuit package system is provided including forming a leadframe having a frame and a die paddle having leads thereon. The leads are held with respect to the die paddle. The leads are separated from the die paddle, and a die is attached to the die paddle. Bond wires are bonded between the leads and the die. The die and bond wires are encapsulated. The leadframe is singulated to separate the frame and the die paddle.

14 Claims, 8 Drawing Sheets

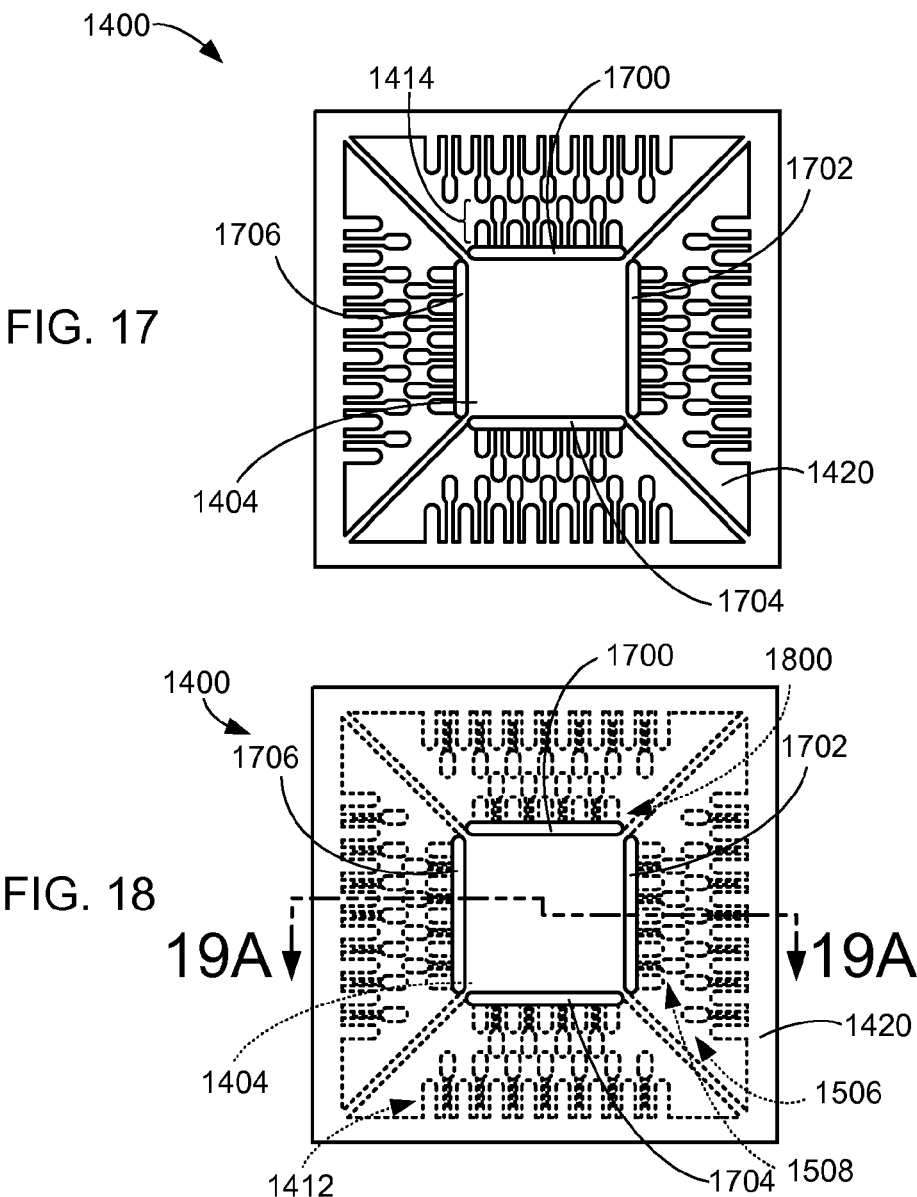
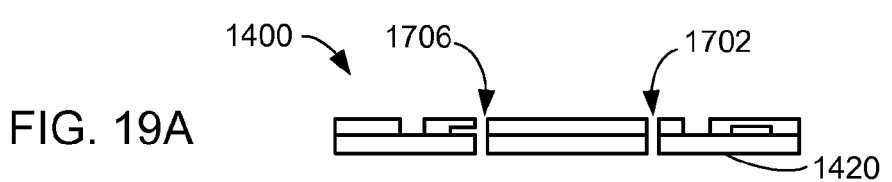
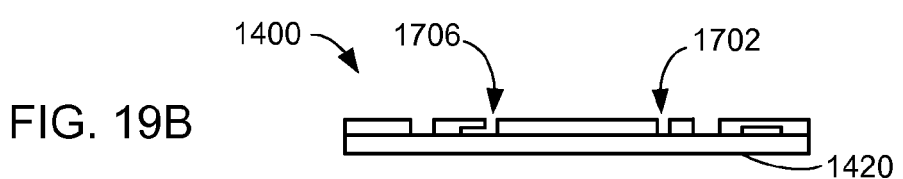

… (1)

INTEGRATED CIRCUIT PACKAGE SYSTEM WITH LEADS SEPARATED FROM A DIE PADDLE

FIELD OF THE INVENTION

The present invention relates generally to integrated circuit packages having leadframes, and more particularly to leadframes having multiple rows of leads.

BACKGROUND ART

Modern consumer electronics, such as cellular phones, digital cameras, and music players, are packing more integrated circuits into an ever-shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. As the integrated circuit content increases in a package, the input and output density increases. The input and output density increase also creates challenges for the printed circuit board. The design of the printed circuit board increases in complexity and congestion resulting from the increase in the input and output density of the package.

Thus, a need still remains for higher lead densities. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system comprising forming a leadframe having a frame and a die paddle having leads thereon. The leads are held with respect to the die paddle. The leads are separated from the die paddle, and a die is attached to the die paddle. Bond wires are bonded between the leads and the die. The die and bond wires are encapsulated. The leadframe is singulated to separate the frame and the die paddle.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 17 is the top view structure of FIG. 14 after separation of the paddle leads from the die paddle;

FIG. 18 is the bottom view structure of FIG. 17;

FIG. 19A is a cross-sectional view of the leadframe of FIG. 18 taken along line 19A-19A of FIG. 18 in accordance with an embodiment of the present invention;

FIG. 19B is a cross-sectional view similar to FIG. 19A in accordance with an alternate embodiment of the present invention;

DETAILED DESCRIPTION OF THE BEST MODES

Figure 1:
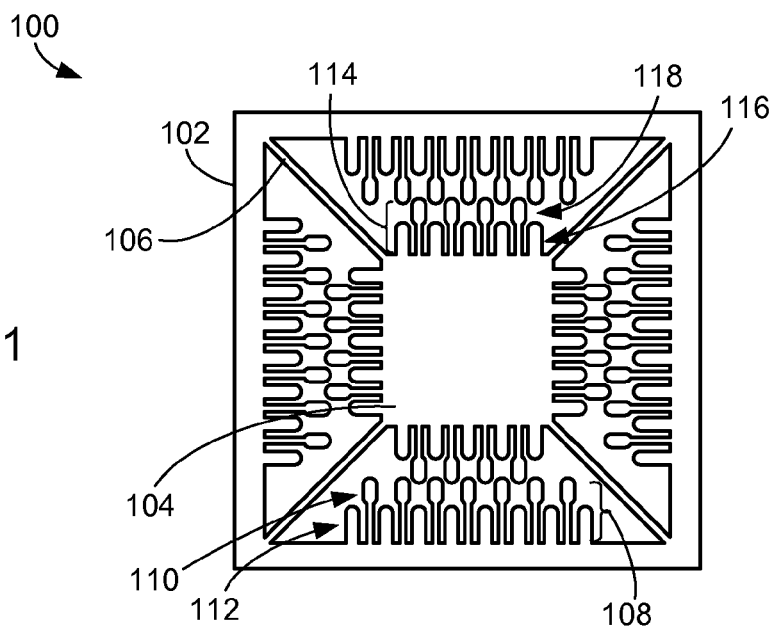
FIG. 1 is a top view of a leadframe in an intermediate stage of manufacturing in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. Similarly, although the views in the drawings for ease of description generally show similar orientations, this depiction in the FIGS. is arbitrary for the most part. Generally, the invention can be operated in any orientation. Similarly, although the sectional views in the drawings for ease of description show the exit ends of orifices as oriented downward, this arrangement in the FIGS. is arbitrary and is not intended to suggest that the delivery path should necessarily be in a downward direction. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements or that one element is integral with another at least during part of the manufacturing process. The term "system" means the method and the apparatus of the present invention as will be apparent from context. The term "processing" as used herein includes stamping, forging, patterning, exposure, development, etching, cleaning, and/or removal of material or laser trimming as required in forming a described structure. The term "system" as used herein refers to and is defined as the method and as the apparatus of the present invention in accordance with the context in which the term is used.

Referring now to FIG. 1, therein is shown a top view of a leadframe 100 in an intermediate stage of manufacturing in accordance with an embodiment of the present invention.

The leadframe 100 includes a frame 102 surrounding a die paddle 104 and supporting the die paddle 104 with tie bars 106.

The frame 102 has frame leads 108 which include inner frame leads 110 and outer frame leads 112. The leads are designated as being inner and outer frame leads with respect to the distance from the die paddle 104, with the inner frame leads 110 proximate to the die paddle 104 and the outer frame leads 112 distal from the die paddle 104.

The die paddle 104 includes paddle leads 114 including inner paddle leads 116 and outer paddle leads 118. The leads are designated as being inner and outer paddle leads with respect to the distance from the die paddle 104, with the inner paddle leads 116 proximate to the die paddle 104 and the outer paddle leads 118 distal from the die paddle 104.

Figure 2:
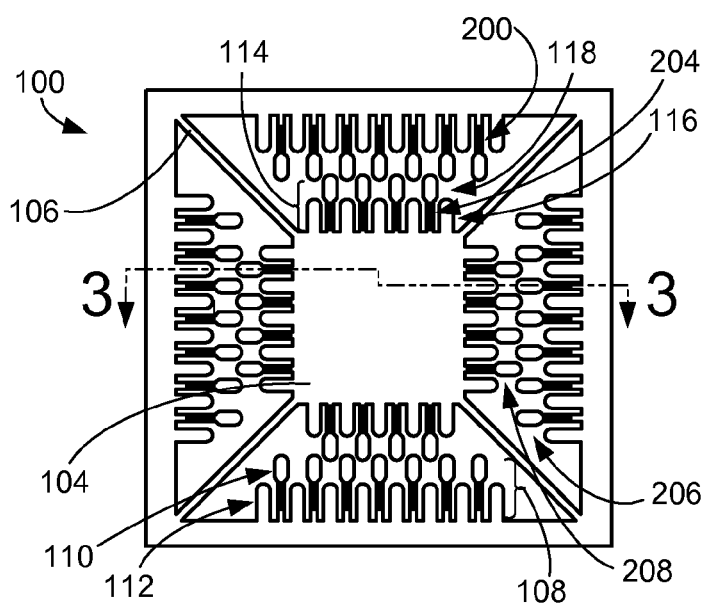
FIG. 2 is a bottom view of the structure of FIG. 1 after a metal removal process.

Referring now to FIG. 2, therein is shown a bottom view of the structure of FIG. 1 after a metal removal process. The bottom of the leadframe 100 has been subject to a metal removal process at portions 200 and 204, which has removed portions of the inner frame leads 110 to leave inner frame pads 206 and portions of the outer paddle leads 118 to leave outer paddle pads 208.

Figure 3:
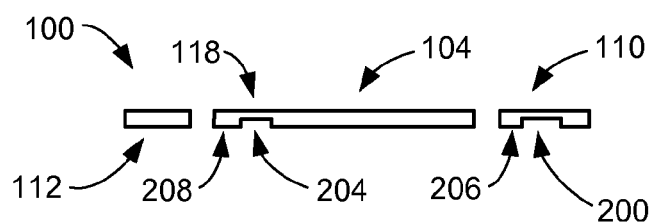
FIG. 3 is a cross-sectional view of the leadframe shown in FIG. 2 taken along line 3-3 of FIG. 2.

Referring now to FIG. 3, therein is shown a cross-sectional view of the leadframe 100 shown in FIG. 2 taken along line 3-3 of FIG. 2. The metal removal process at portions 200 and 204 can be performed by a half-etch process, which etches the inner frame leads 110 and the outer paddle leads 118 etched half way (or any fraction thereof) through in selected portions.

As an option, the leadframe 100 can be pre-plated or plated at this step.

Figure 4:
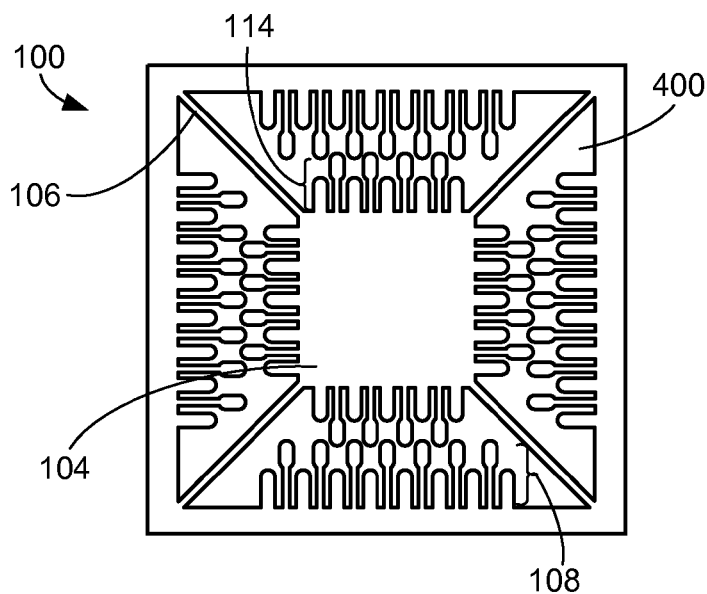
FIG. 4 is the top view structure of FIG. 3 after pre-molding with a pre-molding compound.

Referring now to FIG. 4, therein is shown the top view structure of FIG. 3 after pre-molding. A pre-molding compound 400 fills the openings in the leadframe 100.

Figure 5:
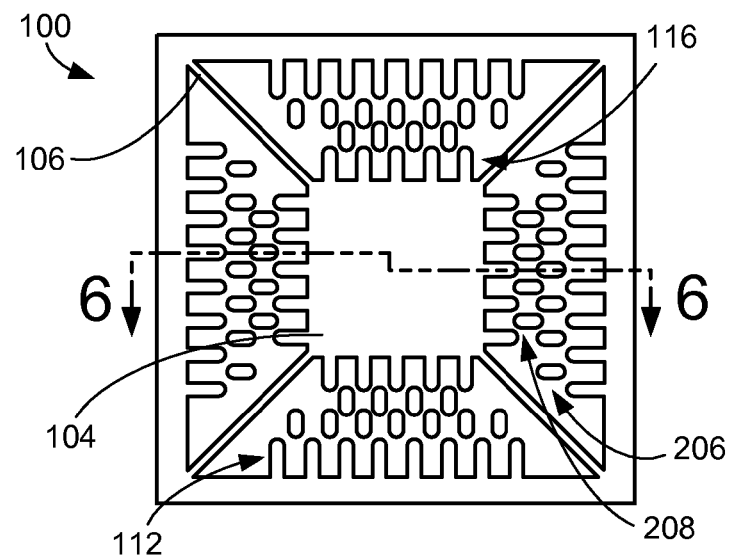
FIG. 5 is the bottom view structure of FIG. 4 after pre-molding.

Referring now to FIG. 5, therein is shown the bottom view structure of FIG. 4 after pre-molding. FIG. 5 shows the pre-molding compound 400 filling the leadframe 100 to leave the frame 102, the die paddle 104, the outer frame leads 112, the inner paddle leads 116, the inner frame pads 206 and outer paddle pads 208 exposed. The pre-molding compound can be an epoxy or other material similar to that used as a package encapsulant.

Figure 6:
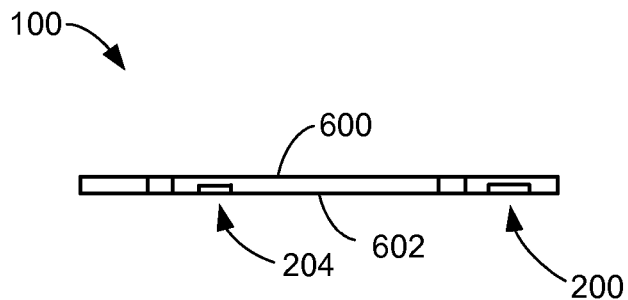
FIG. 6 is a cross-sectional view of the leadframe taken along line 6-6 of FIG. 5.

Referring now to FIG. 6, therein is shown a cross-sectional view of the leadframe 100 taken along line 6-6 of FIG. 5. The cross-sectional view shows that the pre-molding causes the pre-molding compound 400 to fill only the empty areas of the leadframe 100, which leaves a top surface 600 and a bottom surface 602 exposed. The metal removal processed portions 200 and 204 are also filled with the pre-molding compound 400.

Figure 7:
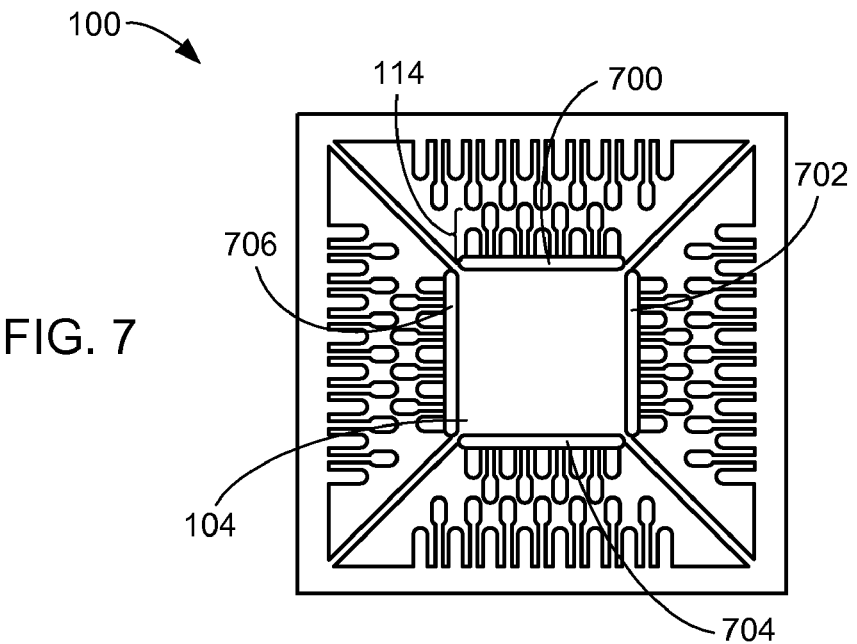
FIG. 7 is the top view structure of FIG. 4 after separation of the paddle leads from the die paddle.

Referring now to FIG. 7, therein is shown the top view structure of FIG. 4 after separation of the paddle leads 114 from the die paddle 104. The separation of the paddle leads 114 opens spaces 700, 702, 704, and 706 between the paddle leads 114 and the die paddle 104.

The open spaces 700, 702, 704, and 706 can be made by punching, etching, water jet abrasion, laser cutting, etc. processes. Each process leaves a characteristic surface finish and shape open surface between the die paddle 104 and the outer paddle pads 208 and inner paddle pads 800.

The pre-molding compound 400 holds the paddle leads 114 in place relative to the die paddle 104 after the open spaces 700, 702, 704, and 706 are made.

Figure 8:
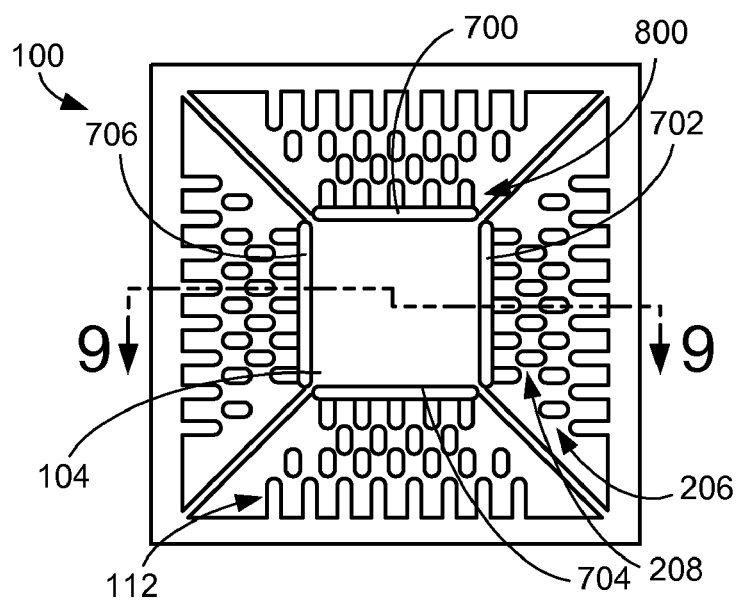
FIG. 8 is the bottom view structure of FIG. 7 after separation of the paddle leads.

Referring now to FIG. 8, therein is shown the bottom view structure of FIG. 7 after separation of the paddle leads 114. The separation of the paddle leads 114 essentially leaves the inner paddle leads 116 as the inner paddle pads 800. Thus, three rows of pads are formed outward from the die paddle 104.

Figure 9:
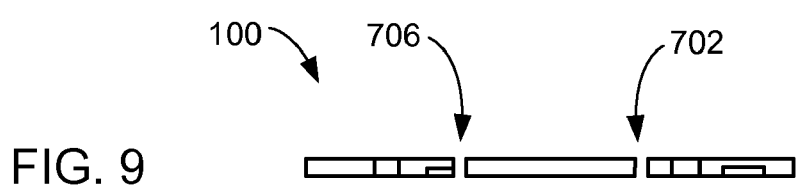
FIG. 9 is a cross-sectional view of the leadframe taken along line 9-9 of FIG. 8.

Referring now to FIG. 9, therein is shown a cross-sectional view of the leadframe 100 along line 9-9 of FIG. 8. The open spaces 702 and 706 (and open spaces 704 and 708) extend entirely through the leadframe 100.

Figure 10:
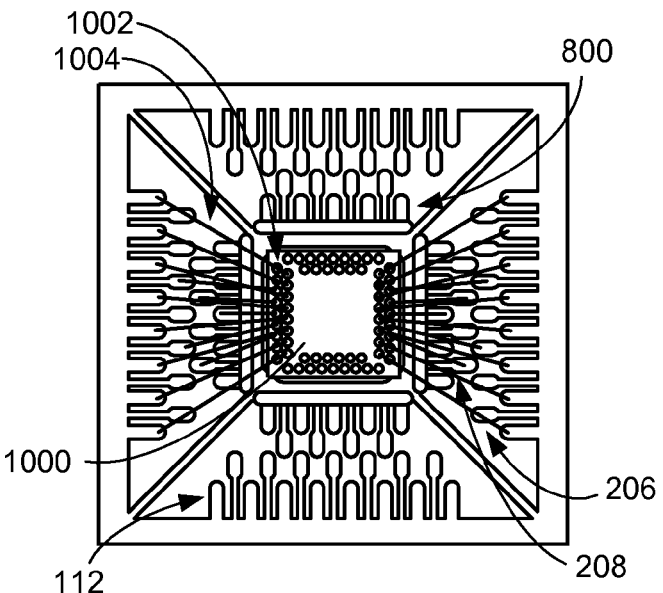
FIG. 10 is the top view structure of FIG. 7 after die-attach and wire bonding.

Referring now to FIG. 10, therein is shown the structure of FIG. 7 after die-attach and wire bonding. A die 1000 is die-attached to the die paddle 104 using a die-attach adhesive. The die 1000 has bonding pads 1002 on the top thereof and bond wires 1004 are attached among the bonding pads 1002 and the outer frame leads 112, the inner frame pads 206, the outer paddle pads 208, and the inner paddle pads 800.

Figure 11:
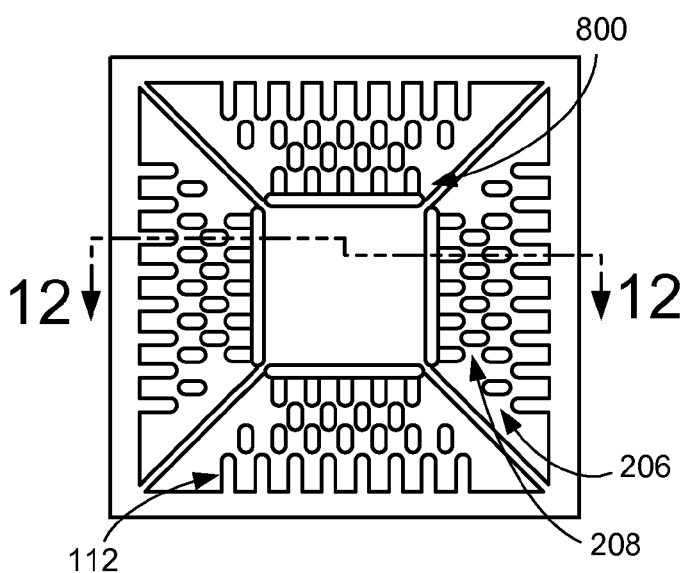
FIG. 11 is a bottom view of the structure of FIG. 10.

Referring now to FIG. 11, therein is shown a bottom view of the structure of FIG. 10.

Figure 12:
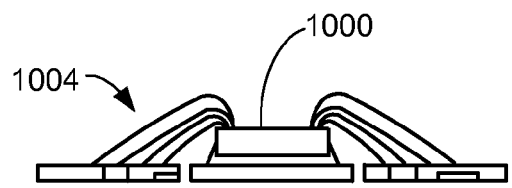
FIG. 12 is a cross-sectional view of the structure of FIG. 11 along line 12-12 of FIG. 11.

Referring now to FIG. 12, therein is shown a cross-sectional view of the structure of FIG. 11 along line 12-12 of FIG. 11.

Figure 13:
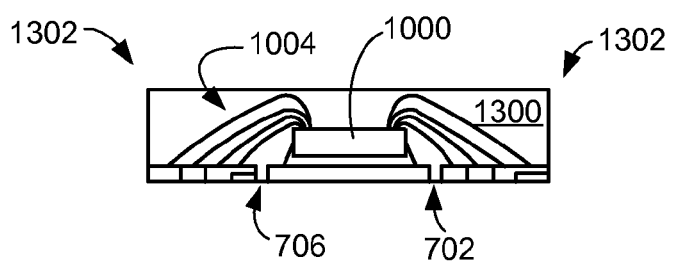
FIG. 13 is the structure of FIG. 12 after encapsulation of the die and the wire bonds in an encapsulant, and singulation.

Referring now to FIG. 13, therein is shown the structure of FIG. 12 after encapsulation of the die 1000 and the bond wires 1004 in an encapsulant 1300, and singulation. The encapsulant 1300 fills the spaces 702 and 706. The structure has been singulated by sawing, laser cutting, water jet abrasion, punching, etc. to cut off the frame 102 and a portion of the encapsulant 1300 to form the integrated circuit package system 1302.

Figure 14:
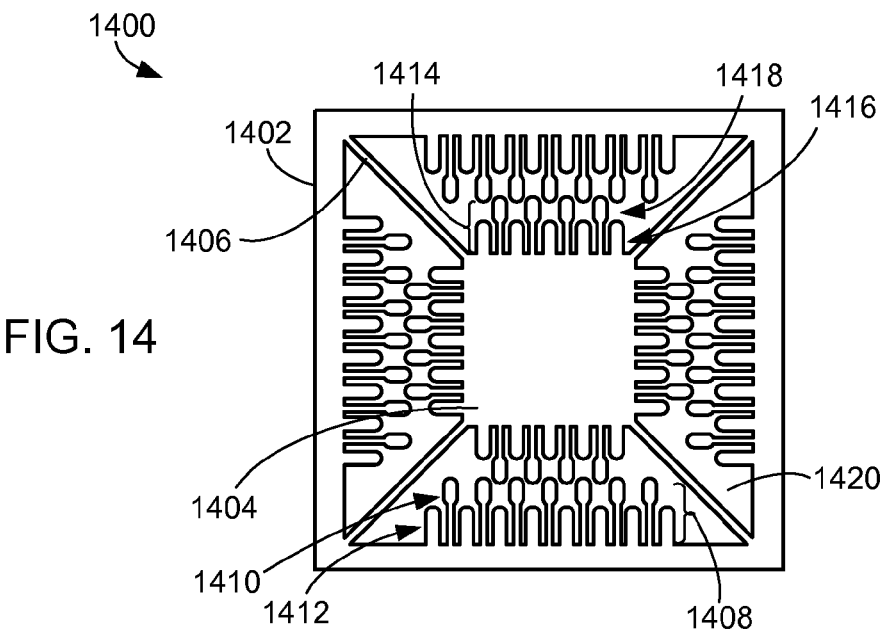
FIG. 14 is a top view of a leadframe in an intermediate stage of manufacturing in accordance with another embodiment of the present invention.

Referring now to FIG. 14, therein is shown a top view of a leadframe 1400 in an intermediate stage of manufacturing in accordance with another embodiment of the present invention.

The leadframe 1400 includes a frame 1402 surrounding a die paddle 1404 and supporting the die paddle 1404 with tie bars 1406.

The frame 1402 has frame leads 1408 which include inner frame leads 1410 and outer frame leads 1412. The leads are designated as being inner and outer frame leads with respect to the distance from the die paddle 1404, with the inner frame leads 1410 proximate to the die paddle 1404 and the outer frame leads 1412 distal from the die paddle 1404.

The die paddle 1404 includes paddle leads 1414 including inner paddle leads 1416 and outer paddle leads 1418. The leads are designated as being inner and outer paddle leads with respect to the distance from the die paddle 1404, with the inner paddle leads 1416 proximate to the die paddle 1404 and the outer paddle leads 1418 distal from the die paddle 1404.

The present embodiment has the leadframe 1400 mounted on a coverlay tape 1420.

Figure 15:
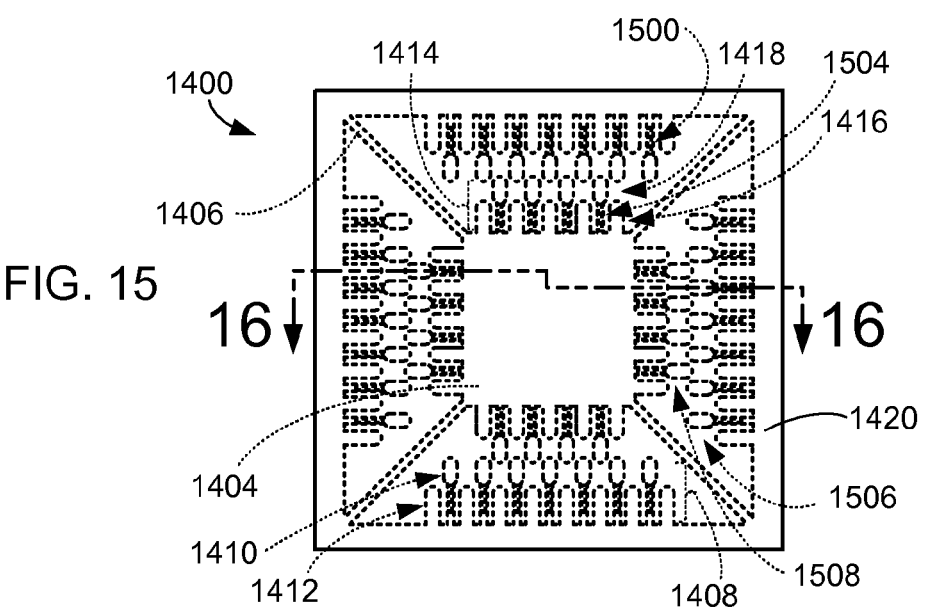
FIG. 15 is a bottom view of the leadframe of FIG. 14 after a metal removal process.

Referring now to FIG. 15, therein is shown a bottom view of the leadframe 1400 of FIG. 14 after a metal removal process. The bottom of the leadframe 1400 has been subject to a metal removal process at portions 1500 and 1504, which has removed portions of the inner frame leads 1410 to leave inner frame pads 1506 and portions of the outer paddle leads 1418 to leave outer paddle pads 1508. The leadframe 1400 is mounted on the coverlay tape 1420.

Figure 16:
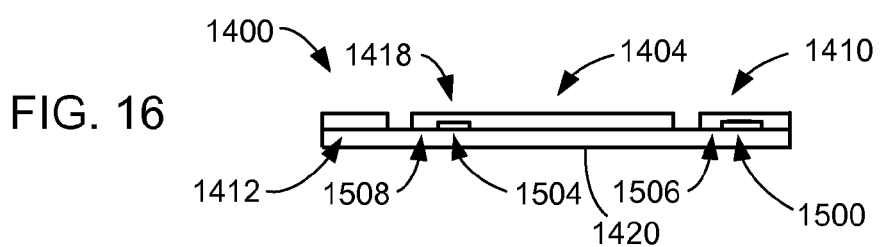
FIG. 16 is a cross-sectional view of the structure of FIG. 15 taken along line 16-16 of FIG. 15.

Referring now to FIG. 16, therein is shown a cross-sectional view of the structure of FIG. 15 taken along the line 16-16 of FIG. 15. The metal removal process at portions 1500 and 1504 can be performed by a half-etch process, which etches the inner frame leads 1410 and the outer paddle leads 1418 etched half way (or any fraction thereof) through in selected portions.

As an option, the leadframe 1400 can be pre-plated or plated prior to this step.

The leadframe 1400 is mounted on the coverlay tape 1420.

Referring now to FIG. 17, therein is shown the top view structure of FIG. 14 after separation of the paddle leads 1414 from the die paddle 1404. The separation of the paddle leads 1414 opens open spaces 1700, 1702, 1704, and 1706 between the paddle leads 1414 and the die paddle 1404.

Referring now to FIG. 18, therein is shown the bottom view structure of FIG. 17. The separation of the paddle leads 1414 essentially leaves the inner leads 1416 as inner paddle pads 1800. Thus, three rows of pads are formed outward from the die paddle 1404.

Referring now to FIG. 19A, therein is shown a cross-sectional view of the leadframe 1400 along line 19A-19A of FIG. 18 in accordance with an embodiment of the present invention. The open spaces 1702 and 1706 extend entirely through the leadframe 1400 and the coverlay tape 1420. Since the open spaces 1702 and 1706 extend through the leadframe 1400 and the coverlay tape 1420, the open spaces 1702 and 1706 may be formed by such processes as punching, water jet abrasion, laser cutting, etc. processes cetera.

The coverlay tape 1420 holds the paddle leads 1414 in place relative to the die paddle 1404 after the open spaces 1700, 1702, 1704, and 1706 are made.

Referring now to FIG. 19B, therein is shown a cross-sectional view similar to FIG. 19A in accordance with in an alternate embodiment of the present invention. The open spaces 1702 and 1706 do extend through the leadframe 1400 but not the coverlay tape 1420. Since the open spaces 1702 and 1706 do not extend through the coverlay tape 1420, etching forms the open spaces 1702 and 1706.

Figure 20:
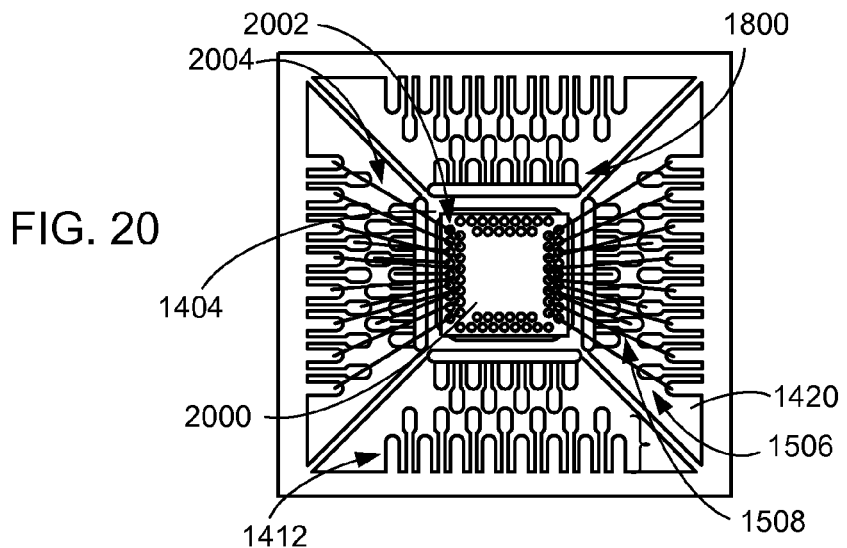
FIG. 20 is the top view structure of FIG. 17 after die-attach and wire bonding.

Referring now to FIG. 20, therein is shown the top view structure of FIG. 17 after die-attach and wire bonding. A die 2000 is die-attached to the die paddle 1404 using a die-attach adhesive. The die 2000 has bonding pads 2002 on the top thereof and bond wires 2004 (typical) are attached among the bonding pads 2002 and the outer frame leads 1412, the inner frame pads 1506, the outer paddle pads 1508, and the inner paddle pads 1800.

Figure 21:
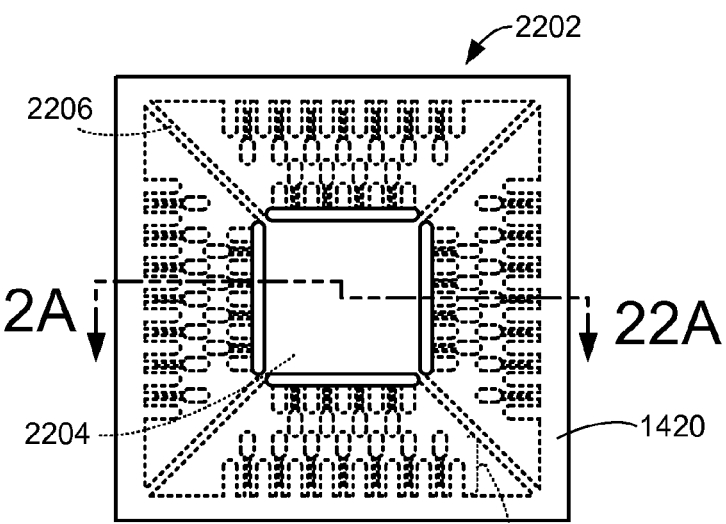
FIG. 21 is the bottom view structure of FIG. 20 with the coverlay tape.

Referring now to FIG. 21, therein is shown the bottom view structure of FIG. 20 with the coverlay tape 1420.

Figure 22A:
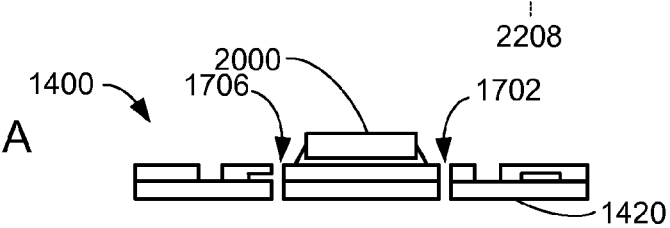
FIG. 22A is a cross-sectional view of the structure of FIG. 21 taken along line 22A-22A of FIG. 21 in accordance with an embodiment of the present invention.

Referring now to FIG. 22A, therein is shown a cross-sectional view of the structure of FIG. 21 along line 22A-22A of FIG. 21 in accordance with an embodiment of the present invention. The spaces 1702 and 1706 extend entirely through the leadframe 1400 and the coverlay tape 1420.

Figure 22B:
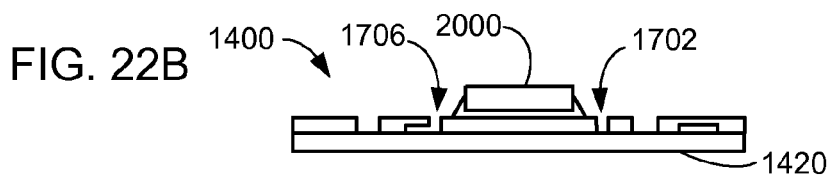
FIG. 22B is a cross-sectional view similar to FIG. 22A in accordance with an alternate embodiment of the present invention.

Referring now to FIG. 22B, therein is shown a cross-sectional view similar to FIG. 22A in accordance with an alternate embodiment of the present invention. The spaces 1702 and 1706 do extend through the leadframe 1400 but not the coverlay tape 1420.

Figure 23:
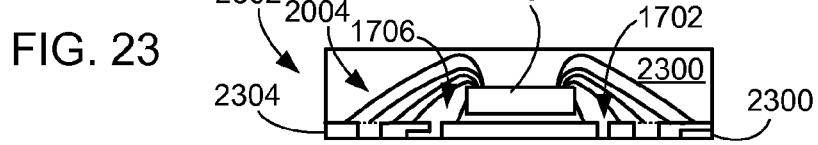
FIG. 23 is the structure of FIG. 21 after encapsulation of the die and the bond wires in an encapsulant.

Referring now to FIG. 23, therein is shown the structure of FIG. 21 after encapsulation of the die 2204 and the bond wires 2004 in an encapsulant 2300. The encapsulant 2300 fills the open spaces 1702 and 1706. The structure has been singulated to cut off the frame 1402 to form an integrated circuit package system 2302 having outer frame pads 2304.

Since the inner paddle pads 1800 and the outer frame pads 2304 are cut at one end, the same the inner paddle pads 1800 and the outer frame pads 2304 are characterized in being the same general size and having the same truncated oblong shape.

The coverlay tape 1420 may be removed either after encapsulation or during singulation.

Figure 24:
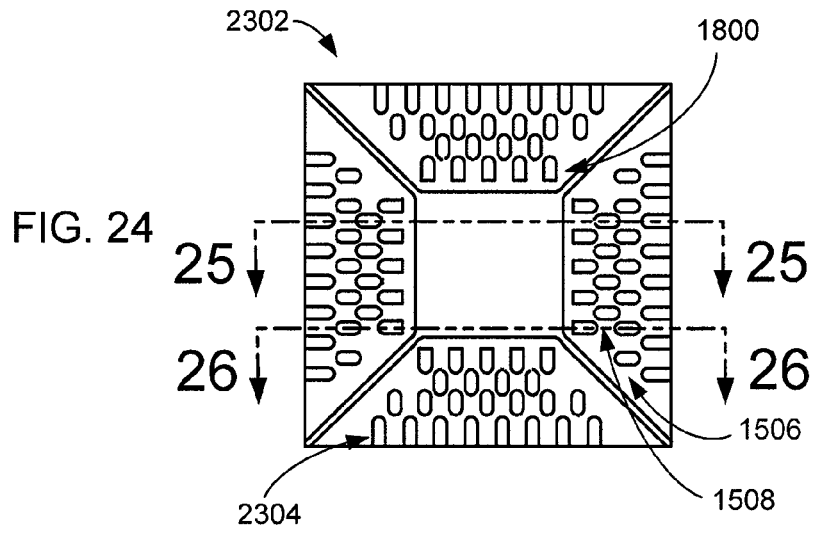
FIG. 24 is a bottom view of the integrated circuit package system of FIG. 23.

Referring now to FIG. 24, therein is shown a bottom view of the integrated circuit package system 2302 of FIG. 23. The integrated circuit package system 2302 has the outer frame pads 2304, the inner frame pads 1506, the outer paddle pads 1508, and the inner paddle pads 1800.

Figure 25:
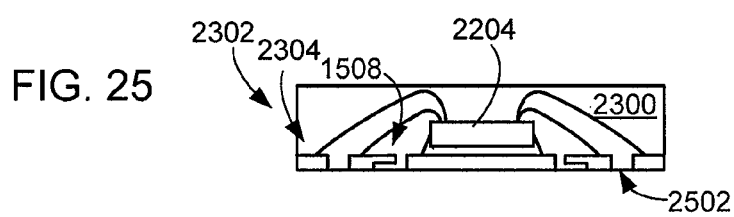
FIG. 25 is a cross-sectional view of the structure of FIG. 24 along line 25-25.

Referring now to FIG. 25, therein is shown a cross-sectional view of the structure of FIG. 24 along line 25-25. The integrated circuit package system 2302 shows the outer frame pads 2304 and the outer paddle pads 1508. A coplanar bottom surface 2502 includes a bottom surface of the outer paddle pads 1805, which were previously separated from the die paddle 1404, of FIG. 14, and a bottom surface of the outer frame pads 2304 exposed from the encapsulant 2300.

Figure 26:
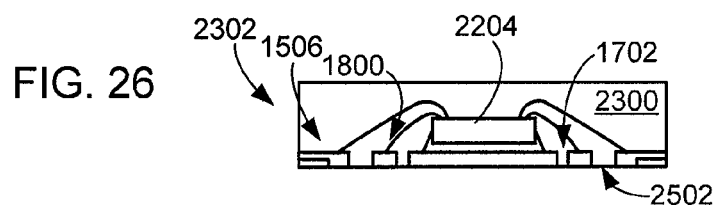
FIG. 26 is a cross-sectional view of the structure of FIG. 24 along line 26-26.

Referring now to FIG. 26, therein is shown a cross-sectional view of the structure of FIG. 24 along line 26-26. The integrated circuit package system 2302 shows the inner frame pads 1506 and the inner paddle pads 1800. The coplanar bottom surface 2502 includes a bottom surface of the inner paddle pads 1800, which were previously separated from the die paddle 1404, of FIG. 14, and a bottom surface of the inner frame pads 1506 exposed from the encapsulant 2300.

Figure 27:
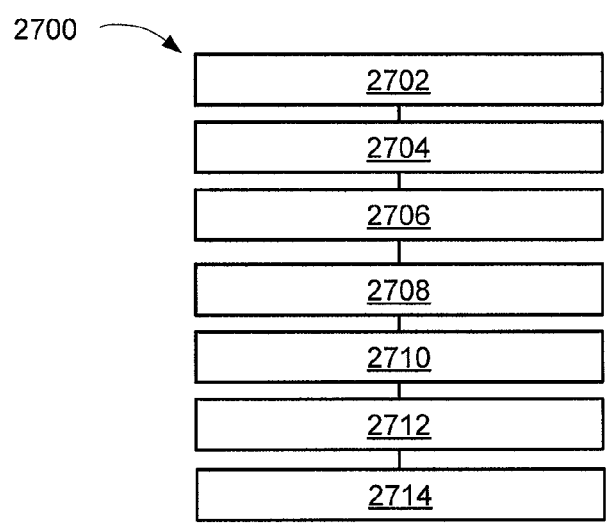
FIG. 27 is a flow chart of an integrated circuit package system for manufacturing the integrated circuit package system in an embodiment of the present invention.

Referring now to FIG. 27, therein is shown a flow chart of an integrated circuit package system 2700 for manufacturing the integrated circuit package system 2302 in an embodiment of the present invention. The integrated circuit package system 2700 includes: forming a leadframe having a frame and a die paddle having leads thereon in a block 2702; holding the leads with respect to the die paddle in a block 2704; separating the leads from the die paddle in a block 2706; attaching a die to the die paddle in a block 2708; bonding bond wires between the leads and the die in a block 2710; encapsulating the die and the bond wires in a block 2712; and singulating the leadframe to separate the frame and the die paddle in a block 2714.

An important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system 2700 of the present invention furnishes important and heretofore unknown and unavailable solutions, capabilities, and functional aspects for integrated circuit package systems. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package systems 2302 compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing an integrated circuit package system comprising:
    forming a leadframe having a frame and a die paddle having leads thereon;
    holding the leads with respect to the die paddle by molding a pre-molding compound between the leads and the die paddle;
    separating the leads from the die paddle;
    attaching a die to the die paddle;
    bonding bond wires between the leads and the die;
    with an encapsulant, the die and the bond wires including exposing the leads, separated from the die paddle, wherein the coplanar bottom surface is formed by a bottom surface of the encapsulant and a bottom surface of the leads exposed from the encapsulant; and
    singulating the leadframe to separate the frame and the die paddle.

2. The method as claimed in claim 1 wherein separating the leads from the die paddle uses punching, water jet abrasion, or laser processing.

3. The method as claimed in claim 1 wherein separating the leads from the die paddle uses etching.

4. A method of manufacturing an integrated circuit package system comprising:
    forming a leadframe having inner frame leads and outer frame leads on a frame and inner paddle leads and outer paddle leads on a die paddle;
    half-etching the inner frame leads and the outer paddle leads;
    holding the inner paddle leads and the outer paddle leads with respect to the paddle by molding a pre-molding compound between the leads and the die paddle;
    separating the inner paddle leads and the outer paddle leads from the die paddle including forming inner paddle pads and outer paddle pads;
    attaching a die to the die paddle;
    bonding bond wires among the die, the inner frame leads, the outer frame leads, the inner paddle pads and the outer paddle pads;
    forming a coplanar bottom surface by encapsulating with an encapsulant the die and the bond wires including exposing the inner paddle leads and the outer paddle leads, separated from the die paddle, wherein the coplanar bottom surface is formed by a bottom surface of the encapsulant and a bottom surface of the leads exposed from the encapsulant; and
    singulating the leadframe to separate the frame from the inner frame leads and the outer frame leads.

5. The method as claimed in claim 4 wherein separating the inner paddle leads and the outer paddle leads from the die paddle uses punching, water jet abrasion, or laser processing.

6. The method as claimed in claim 4 wherein separating the inner paddle leads and the outer paddle leads from the die paddle uses etching.

7. The method as claimed in claim 4 wherein:
    separating the inner paddle leads and the outer paddle leads from the die paddle opens a space between the die paddle and inner paddle leads and the outer paddle leads.

8. An integrated circuit package system comprising:
    a die paddle;
    lead pads characterized in being separated from the die paddle;
    a die-attached to the die paddle;
    a pre-molding compound molded between the lead pads and the die paddle;
    bond wires connected between the lead pads and the die; and
    a coplanar bottom surface formed by a bottom surface of an encapsulant encapsulating the die and the bond wires, and a bottom surface of the lead pads, separated from the die paddle and exposed from the encapsulant.

9. The system as claimed in claim 8 wherein the lead pads include a characteristic surface finish of being separated from the die paddle by punching, water jet abrasion, or laser processing.

10. The system as claimed in claim 8 wherein the lead pads include a characteristic surface finish of being separated from the die paddle by etching.

11. The system as claimed in claim 8 wherein:
the lead pads include inner paddle pads and outer paddle pads characterized in being separated from the die paddle;
inner frame pads and outer frame pads characterized in being singulated by sawing, laser cutting, water jet abrasion, or punching;
the inner frame pads and the outer paddle pads having metal removed from the undersides thereof;
the inner paddle pads and outer paddle pads held with respect to the die paddle; and
the bond wires among the die, the inner frame pads, the outer frame pads, the inner paddle pads, and the outer paddle pads.

12. The system as claimed in claim 11 wherein the inner paddle pads and the outer paddle pads are characterized in being separated from the die paddle by punching, water jet abrasion, or laser cutting.

13. The system as claimed in claim 11 wherein the inner paddle pads and the outer paddle pads are characterized in being separated from the die paddle by etching.

14. The system as claimed in claim 11 wherein the pre-molding compound holds the inner paddle pads and the outer paddle pads with respect to the die paddle.

* * * * *

UNITED STATES PATENT AND TRADEMARK OFFICE
CERTIFICATE OF CORRECTION

| | | |
|---|---|---|
| PATENT NO. | : 8,278,148 B2 | Page 1 of 1 |
| APPLICATION NO. | : 11/854989 | |
| DATED | : October 2, 2012 | |
| INVENTOR(S) | : Punzalan et al. | |

It is certified that error appears in the above-identified patent and that said Letters Patent is hereby corrected as shown below:

In the Claims:

Column 7, claim 1, line 66, insert --forming a coplanar bottom surface by encapsulating-- before "with an encapsulant, the die and the bond wires including"

Column 8, claim 4, line 20, delete "the paddle" and insert therefor --the die paddle--

Signed and Sealed this
First Day of April, 2014

Michelle K. Lee
*Deputy Director of the United States Patent and Trademark Office*